United States Patent

Gorfinkel et al.

Patent Number: 5,321,253
Date of Patent: Jun. 14, 1994

[54] METHOD OF AND MEANS FOR CONTROLLING THE ELECTROMAGNETIC OUTPUT POWER OF ELECTRO-OPTIC SEMICONDUCTOR DEVICES

[75] Inventors: Vera B. Gorfinkel, Saratov; Serge A. Gurevich, Leningrad, both of U.S.S.R.

[73] Assignee: Biota Corp., Locust Valley, N.Y.

[21] Appl. No.: 19,713

[22] Filed: Feb. 19, 1993

Related U.S. Application Data

[63] Continuation-in-part of Ser. No. 815,174, Dec. 31, 1991, Pat. No. 5,274,225.

[51] Int. Cl.$^5$ .................................... H01J 40/14
[52] U.S. Cl. .................................. 250/214 C; 257/184; 372/34
[58] Field of Search ..... 250/214 C, 214 RC, 214 AG, 250/238; 257/184, 23; 372/34, 36, 45, 46

[56] References Cited

U.S. PATENT DOCUMENTS 4,806,997  2/1989  Simmons et al. .................. 257/184
5,157,467  10/1992  Fujii .................................. 257/184

Primary Examiner—David C. Nelms
Assistant Examiner—Que T. Le

[57] ABSTRACT

The output electromagnetic power of optoelectric heterojunction semiconductor devices having an active semiconductor layer with a mobile charge carrier plasma is controlled by applying a microwave electric field inside the active layer by means of at least two semiconductor contacts to the active layer that are conducting to at least one type of mobile charge carrier and blocking to another type of charge carrier. An electrical signal is applied inside the active layer to transform the distribution of energies and equivalent temperature of the charge carriers of the mobile charge carriers in order to control light emission and absorption in the active layer. A modulator is disclosed with two such semiconductor contacts on the active layer in which charge carriers are optically generated. A monolithically integrated, cavity-coupled laser and modulator is disclosed in which the laser and modulator are fabricated on a common substrate and the laser is a distributed feedback laser (DFB). Another monolithically integrated cavity-coupled laser and modulator is fabricated in which the laser and modulator are coupled Fabrey-Perot optical cavities separated by a low-loss, 1–3 um groove. Operating modes of the modulator and laser are disclosed which include synchronously controlling the intensity period and phase of the signal controlling the electric field inside the active layer of the modulator and the signal controlling the laser. Best mode of operation is disclosed in which the signal sources to the laser and modulator are synchronously controlled to a cavity-coupled monolithically integrated laser and modulator, thereby generating short pulses of photonic radiation at a high data rate and with best mode and spectral quality.

22 Claims, 2 Drawing Sheets

METHOD OF AND MEANS FOR CONTROLLING THE ELECTROMAGNETIC OUTPUT POWER OF ELECTRO-OPTIC SEMICONDUCTOR DEVICES

This is a continuation-in-part of application Ser. No. 07/815,174, filed Dec. 31, 1991 U.S. Pat. No. 5,274,225.

BACKGROUND OF THE INVENTION

1. Field of the Invention

This invention relates to high frequency, high bit-rate, optoelectric (photonic) heterojunction devices and more particularly, to controlling the equivalent temperature of the energy distribution fraction of the mobile charge-carrier plasma and gain in the active layer of the heterojunction in order to control the electromagnetic output power.

2. Description of the Prior Art

Optoelectronic semiconductor devices that emit electronic radiation are used extensively today for applications such as, for example, fiber-optic telecommmications and laser printers. These devices include light-emitting diodes (LED) and the diode laser. Other such devices detect and modulate optical signals generated by an external radiation-emitting oscillator, while others convert optical electronic radiation into electrical energy. The theory and operation of these devices are well understood in the art as was discussed in the book "Physics of Semiconductor Lasers" by S. M. Sze, Chapter 12, p. 736, pub. by John Wiley & Sons, New York, 1981.

Furthermore, as also described in the book by Sze, Chapter 12, Sec. 12.5.1, referenced above, heterostructures with low threshold current density have been designed by the use of: "carrier confinement provided by the energy barriers of higher bandgap semiconductor surrounding the active region, etc." More recently, small, efficient quantum well optoelectronic switching devices, such as the optical modulators and switches that were described in the article entitled "Quantum Well optoelectronic Switching Devices" by D. A. B. Miller, Int. J. of High Speed Electronics, Vol. 1, No. 1, pp 19–46, March 1990, are capable of logic themselves and have potential for integration, and in the article entitled "Advances in Optoelectronic Integration" by O. Wada, Int. J. of high Speed Electronics, Vol. 1, No. 1, pp 47–71, March 1990, which reviewed the latest advances in optoelectronic integration. Furthermore, in the article entitled "Analysis of Semiconductor Microcavity Lasers Using Rate Equations" by G. Bjork and Y. Yamamoto, IEEE J. of Quantum Electronics, Vol. 27, No. 11, pp 2386–2396, Nov. 1991, equations that might achieve microcavity lasers with higher modulation speeds than previous devices were theoretically considered.

Devices for optical power modulation, such as described above, can be divided into two groups: active and passive devices. Active devices radiate electromagnetic power simultaneously with modulation and passive devices only modulate the radiation that passes through them. In all these devices, high frequency and high pulse rate modulation of optical power is the problem of importance in optical communication and high data rate system.

However, it is well known in the art that at present the maximum effective modulation bandwidth is limited to about 10 GHz for semiconductor lasers and to about 1 GHz for light diodes (Sze referenced above). Consequently, to investigate the limits on bandwidth, V. B. Gorfinkel and I. I. Filatov, in the article entitled "Heating of an Electron Gas by an hf Electric Field in the Active Region of a Semiconductor Heterolaser", Sov. Phys. Semicond., Vol. 24, No. 4, April 1990, investigated theoretically the influence of the heating of electron gas by an electric field E(t) in the heterostructure AlGaAs, GaAs, AlGaAs on the optical gain. We considered only the energy balance equation and the carrier density rate equations in order to determine theoretically the influence of electric field $E(t)=E_0+E_1 \sin(2\pi ft)$ on the optical gain. Indeed, our theoretical analysis indicated that (where f is the applied signal frequency and t is time) depending on the ratio of the variable and constant components of the heating field $E_1$ and $E_0$, the optical gain value may theoretically be modulated both at signal frequency f and at double frequency 2 f up to f=400 GHz! But, this theoretical analysis (Gorfinkel & Filatov) above did not consider any actual lasing operation and did not take into account any rate equation for light. Thus, our initial theoretical analysis encouraged us to proceed further with a new analysis and, if promising, to investigate new methods that might overcome the bandwidth problems associated with the prior art.

Subsequently, as described in the article entitled "High Frequency Modulation of Quantum Well Heterostructure Diode Lasers by Carrier Heating in Microwave Electric Field" by S. A. Gurevich et al, Joint Soviet-American Workshop on the Physics of Semiconductor Lasers, p. 67, May 20–Jun. 3, 1991, our more complete theoretical analysis that considered the laser equations among others revealed that the optical gain of a quantum well heterostructure can be modulated by a spatially controlled microwave electric field when the field is applied by semiconductor contacts to the active layer. Our results were particularly surprising because Takamiza et al in Proc. IEEE, Vol. 56, No. 1, p. 135, 1968, failed in their early attempts to modulate laser output by placing samples in a microwave waveguide. Thus our method, which includes controlling the period and spatial distribution of the electric field inside the active layer, appears to have overcome the problems of the prior art.

More recently, Gorfinkel and Luryi published in Applied Physics Letters, 60 (25), 22. Jun. 1992, pp 3141–3143, an article entitled "Rapid Modulation of Interband Optical Properties of Quantum Wells by Intersubband Absorption" in which we calculated theoretically that intersubband radiation can control the mobile electron temperature and modulate the optical properties of a semiconductor quantum well. Our calculations in this article of a modulator are based on the same concepts described in the parent application relating to modulating by heating of one mobile charge carrier, but substituting intersubband radiation from a $CO_2$ laser for heating mobile electron charge carriers.

The entire specifications of the parent application Ser. No. 07/815,174 filed on Dec. 31, 1991, are particularly incorporated herein, including the Detailed Description of the Preferred Embodiments.

Furthermore, applicants request that the prior art patents cited by the Examiner during examination of the parent application, namely U.S. Pat. No. 5,119,393, which issued to Oka on Jun. 2, 1992, and U.S. Pat. No. 5,081,633, which issued to Danner on Jan. 14, 1992, be made references of record in the present continuationin-part. Both patents described lasers that were constructed with a plurality of optical cavities and with a plurality of electrodes. Oka teaches the use of a p-n junction to pump both types of charge carriers and Danner teaches the use of an indirect bandgap active layer and a constant electric field to transform the indirect material to direct bandgap. Thus, neither Oka nor Danner can fraction in accordance with the present invention to generate short pulses of photonic radiation by heating one type of charge carrier with a modulated electric field, as discussed below in connection with FIG. 5.

SUMMARY OF THE INVENTION

It is an object of the invention to extend frequency bandwidth of active and passive optoelectronic heterojunction semiconductor devices above 50 GHz.

Another object is to provide optoelectronic heterojunction devices with output pulses in the picosecond range.

Another object is to modulate and to heterodyne two signals at frequencies above 50 GHz.

More particularly, we found that when a periodic electric field is applied inside the active layer of an electronic heterojunction device by contacts that are conducting for one type and blocking for another type of the mobile charge carrier the equivalent energy-distribution-function temperature of the mobile charge carrier plasma is increased and the optical gain of the active layer is decreased at a relaxation response time in the picosecond range. Furthermore, we found that, by controlling spatially and temporally the electric field applied to the mobile charge carrier of the plasma inside the active area, the temperature and spatial energy distribution of the charge carriers can be selectively controlled to modulate the electromagnetic output and, when the phase of the electric field and pumping current signals are controlled, to generate picosecond output pulses.

DETAILED DESCRIPTION OF THE PREFERRED EMBODIMENTS

Figure 1:
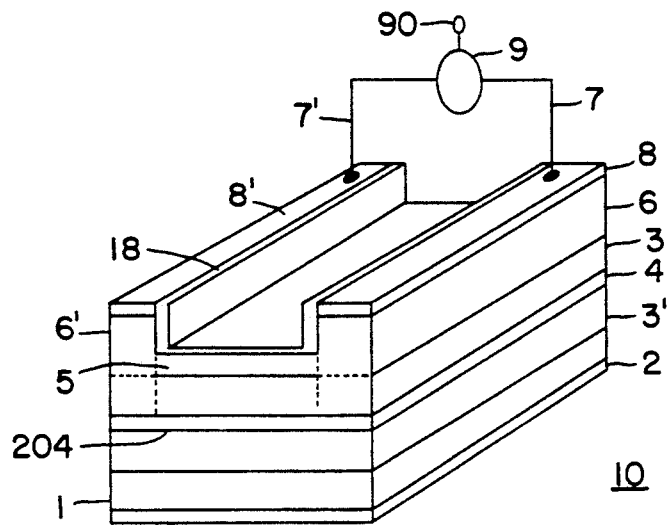
FIG. 1 is a cross-sectional view of an optoelectric heterojunction modulator with semiconductor contacts for controlling the electric field inside the active layer.
Figure 2:
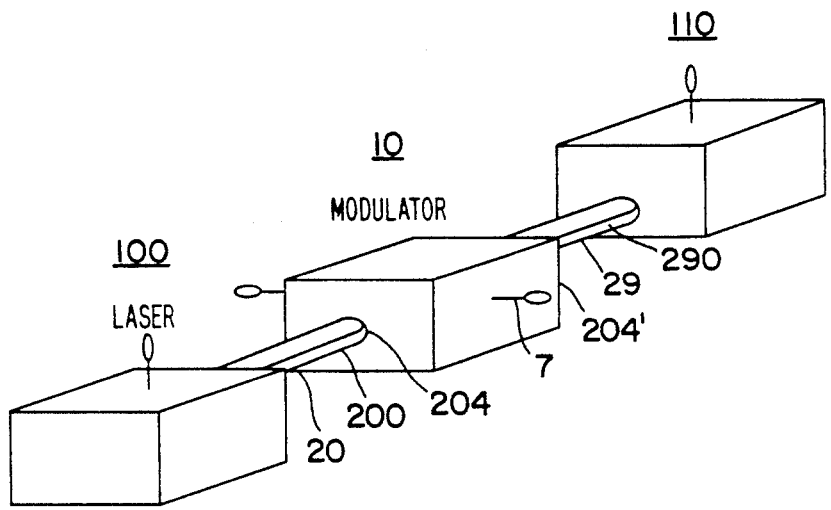
FIG. 2 illustrates a schematic block diagram of the modulator illustrated in FIG. 1 with an external laser providing a beam of photonic radiation through a fiber optic connection for optically generating mobile charge carriers In the active layer and a utilization network.

FIG. 1 and FIG. 2 show a schematical crossectional view and block diagram of one embodiment of the invention in which free charge carriers are generated in active layer 4 of modulator 10 by a beam of photonic radiation 20 from external laser 100 through antireflection layer 204 deposited onto the face of active layer 4. The photon energy of beam 20 is greater than the forbidden band of the active layer (interband radiation). Active layer 4, which is positioned between two cladding layers 3 and 3' to form a waveguide, is supported by a semi-insulating substrate 1 of GaAs. Active layer 4 is, for example, heavily doped n+ GaAs, 0.2 um thick sandwiched between the two undoped cladding layers 3 and 3' of $Al_xGa 1-x As$ 0.1 um thick. An upper cladding layer 5 of $Al_y Ga 1-y As$ is shown with an $SiO_2$ (or $Si_3N_4$) protective dielectric coating 18. Semiconductor contacts 6 and 6' of heavily doped n+ GaA make ohmic contact to active layer 4 at the two outside edges. Semiconductor contacts 6 and 6' are shown to penetrate preferably through the wave guiding layers 3 and 3' in order to make ohmic contact directly to active layer 4. Metallic contacts 8 and 8' are made to semiconductor contacts 6 and 6'. Leads 7 and 7' electrically connect power source 9 through metallic contacts 8 and 8' and semiconductor contacts 6 and 6' to active layer 4, thereby applying an electric field inside active layer 4. Thus, when signal source 9 applies a modulated signal to contacts 8 and 8' through leads 7 and 7' to active layer 4, the electric field and heating current inside active layer 4 are modulated concomitantly.

Furthermore, as shown in FIGS. 1 and 2, lead 90, which is connected to signal source 9, feeds a portion of the signal to external laser 100 to synchronize the application of the signal source 9 to active modulator 10 and the signal source 109 to the laser 100. As shown schematically in FIG. 2, a modulated beam 20 of photonic radiation emitted by laser 100, which may be a commercially available design, is coupled through optical fiber 200 through the AR coating 204 into active layer 4 of the modulator 10. The AR coating 204 is deposited on a face of active layer 4 orthogonal to its optical waveguide axis. The modulated beam 29 exits through AR coating 204' into optical fiber 290 and into an appropriate optical network 110. Inside active layer 4, the photons of laser beam 20 optically generate mobile charge carriers (hole-electron pairs) when the photon energy is greater than the forbidden band. Multiple photons are required when the photon energy is less than interband.

In operation, both electron and holes are generated by laser beam 29 incident on active layer 4. Electrons are then heated above lattice temperature when the electric field from signal source 9 is applied inside layer 4 through leads 7 and 7', contacts 8 and 8' and semiconductor contacts 6 and 6', which are blocking to holes and conducting to electrons in active layer 4. Also, the gain in active layer 4 and the energy distribution fraction of the charge carriers, which is equated to the equivalent electron temperature, are modulated by modulating the electric field. Further, we found that when the laser beam 20 is adjusted to low intensity to generate a correspondingly low mobile charge carrier density in active layer 4, the change in the mobile electron temperature directly modulates the gain of the medium of the active layer 4 in accordance with equation 4 of the parent application. The intensity of the output pulses of beam 29 that exits into fiberoptic 29 is then modulated by the gain of the active layer 4. Thus, the temperature of the mobile electrons is modulated by the electric field in a manner similar to that described in the parent application in connection with FIG. 1 and equations 1-7; but, the initial density of charge carriers is controlled by the intensity of laser beam 20 incident on active layer 4 and the output pulses of photonic radiation 29 emitted from modulator 10 are controlled by synchronously controlling the intensity period and phase of the signal source 9 of modulator 10 and the laser 100 as discussed above.

Figures 3A, 3B, 3C:
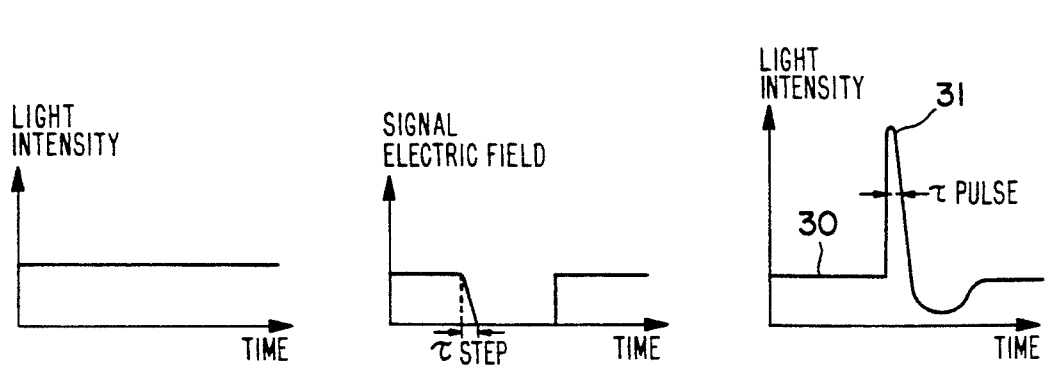
FIGS. 3a, 3b and 3c are diagrams illustrating the incident laser light intensity, the heating electric field applied inside the active layer, and the pulses emitted from the active layer.

On the other hand, under high intensity photonic radiation from laser 100, as shown in FIGS. 3a, b, c, we found that fast, high-intensity photonic pulses were generated by modulator 10 as shown in FIG. 3c. More specifically, FIG. 3a shows interband light that impinges on the active layer 4 as being of constant intensity for the short period of time illustrated. FIG. 3b shows the electric field rapidly decreased with a gradient for a time $\Delta t$. FIG. 3c shows the pulses of photonic radiation emitted with a very short pulse length. Thus, when the period of intensity and phase of the modulator are synchronized with the modulation signal of the laser, the period intensity and phase of the emitted photonic radiation can be controlled and the device 10 selectively fractions as modulator, amplifier, oscillator or pulse generator.

Although the precise physics of pulse emission is not fully understood, one possible explanation is that, since the electron temperature relaxes faster than that of the holes, when the electric heating field is removed and the electron temperature relaxes back to lattice temperature, an excess number of free charge carriers remain, rapid recombination of charge carriers simulates emission of pulses of photons. Thus, the pulse intensity is relatively larger and its width is shorter than that from conventional lasers.

Figure 4:
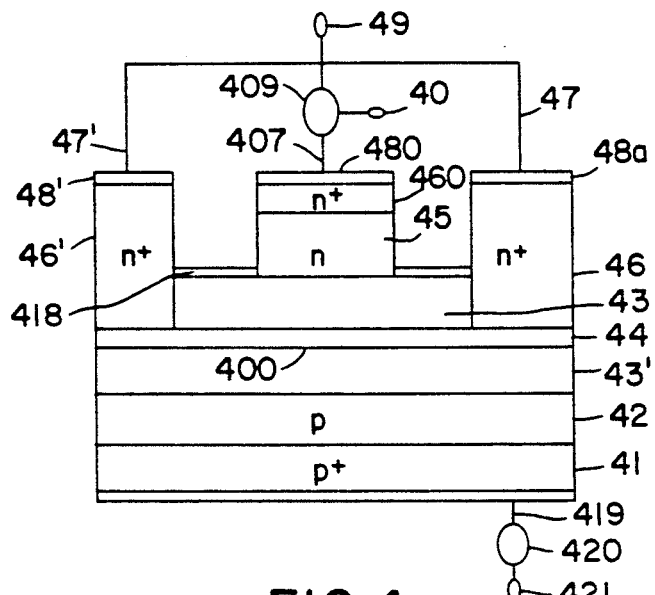
FIG. 4 illustrates a cross-sectional view of an optoelectric heterojunction modulator with pumping contacts.

FIG. 4 is a cross sectional schematical view of another embodiment of the invention in which the heating electric field inside active layer 4 is applied by three electrodes 48, 48' and 480, thereby applying a more symmetrical electric field and potential distribution in active layer 44 than that applied through the two contacts described in connection with FIG. 1. Active layer 44 is, for example, low bandgap, high-index n' GaAs positioned between two high bandgap, low index $Al_xG_{1-a}$ As wave-guiding layers 43 and 43', each 0.1 um thick. A cladding layer 45 of n-type AlGaAs may be added to upper cladding layer 43, in which y>x and x≦ 3 so that the bandgap of layers 43, 43' and 45 are direct. Heavily doped n+ GaAs layers 46 and 46' preferably contact directly active layer 44 at its two outside edges and n-type AlGaAs layer 460 contacts layer 45. Doped layers 46, 46' and 460 are contacted by metallic layers 48, 48' and 480 respectively. Metallic layers 48, 48' and 480 are electrically connected to signal source 49a through leads 47, 47' and 470. Electrodes 48 and 48' are shown connected together through leads 47 and 47'. Dielectric isolation layer 418 is deposited on waveguide layer 418 (and other surfaces if desired) to minimize leakage current between electrodes 48, 48' and 480. Substrate 41 may be p-type GaAs in contact with an AlGaAs confinement layer 42 and waveguiding layer 43' so that a pumping signal from signal source 420 may be applied across active layer 44 through lead 419. When the pumping signal 420 is applied to active layer 44' by connecting lead 421 to metallic layer 480, holes and electrons are generated in active layer 44 even without the application of an external laser beam.

In operation, charge carriers are generated in active layer 44 and an electric field is applied to active layer 44 by signal source 409 through semiconductor contacts 46, 46' and 460 which are conducting to electrons and blocking to holes in active layer 4. Thus, when charge carriers are generated in active layer 44, the distribution of energies of the charge carriers is altered and the equivalent electron temperature is increased substantially above lattice temperature by modulating the intensity period and phase of the electric field applied to active layer 44, thereby controlling the intensity, period and pulse width of the emitted pulses as discussed in connection with FIG. 1.

Furthermore, the optical cavity between AR coatings 400 and 400' deposited on the cleaved faces of layer 44 may be tuned as a Fabrey-Perot cavity to maximize the quality of the output beam of pulses emitted by active layer 44 which are modulated by signal source 409. In one mode of operation, the p+ type GaAs substrate 41 is connected to power source 420 in order to inject holes into active layer 44 to increase the number density of charge carriers, and the signal source 409 is applied to active layer 44 to control electron temperature and gain. Signal sources 420 are preferably synchronized through a suitable signal through lead 40. Again, high modulation rates and short pulse are emitted by active layer 44 through AR window 400 which are controlled by signal source 409.

Figure 5:
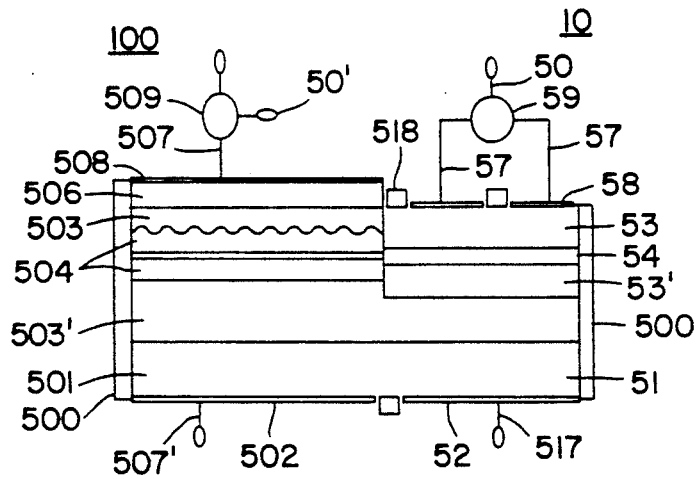
FIG. 5 illustrates in cross-section a novel optoelectric heterojunction semiconductor device having a DFB laser and modulator integrated on a common substrate.

Referring now to FIG. 5, a modulator 10 with active layer 54 is integrated with a laser oscillator-amplifier section 100 having an active waveguide layer 504 on a common semi-insulating GaAs substrate 51. The active layer 54 of modulator 10 is, for example, 0.2 micrometer n+ GaAs positioned between two AlGaAs waveguide layers 53 and 53' which have a higher bandgap and lower index of refraction than active layer 54. The laser section 100 is shown as a distributed feedback laser (DFB) with a corrugated Bragg reflector in waveguide 504. Waveguide 504 may be a 100A GaAs quantum layer surrounded by two AlGaAs layers. The optical axis of waveguide 504 and active layer 54 are aligned. The modulator 10 and laser 100, which are integrated on common substrate 51 of p-type GaAs, have a common cladding layer 503'. An upper cladding layer 503 of p-type AlGaAs is electrically contacted by p+ GaAs layer 506, metallic coating 508 and lead 507 so that a modulated pumping signal from signal source 509 can be applied to layer 504. The electric circuit between layer 504 and signal source 509 is completed through lead 507' connected to metallic layer 502 on substrate 501, thereby completing the pumping loop.

Referring to the modulator section 10 of FIG. 5, signal source 59 is connected by leads 57 to two electrodes 58 which are in electrical contact with waveguide layer 53 and active layer 54. Consequently, when a modulated signal from signal source 59 is applied to active layer 54 through leads 57, electrodes 58 and the portion of semiconductor waveguide layer 53 under metallic contacts 58, a modulated electric field is applied to active layer 54 having both transverse and longitudinal vector components. The modulated electric field then heats the electrons as described above in connection with FIGS. 1, 2 and 3, except that the longitudinal components of the electric field Inside active layer 54 In modulator 10 of FIG. 5 are parallel to its optical axis, whereas, in the modulator shown in FIG. 1, the longitudinal components of the electric field vectors are orthogonal to the optical axis of active layer 4. Also, a transverse electric field may be applied to active layer 54 by connecting signal source 59 through lead 517 to metallic contact 52 on substrate 51. Thus, when substrate 51 and both waveguide layers 53 and 53' are n-type semiconductors, the semiconductor contacts to active layer 54 are conducting to electrons and blocking to holes, thereby efficiently projecting the electric field derived from the modulated signal source 59 into active layer 54, and, the heating effect by the electric field inside active layer 54 is similar to that described in connection with FIGS. 1, 2 and 3 of the present application and FIG. 1 of the parent application along with equations 1-7, all of which are incorporated by reference to the parent specifications.

Furthermore, in the integrated device shown in FIG. 5, the optical axis of the active layer 54 and DFB laser 504 are carefully aligned to form optical cavities and the length of both optical cavities are adjusted to an even number of wavelengths to facilitate multiple passes and to maximize the modulated photonic emission output. An additional optical input may be introduced through AR coatings 500 and 500' if additional optical stimulation is desired. The intensity period and phase of signal sources 59 and 509 may be controlled and synchronized by signals through leads 50 and 50' so that low-chirp pulses are emitted with good spectrum purity. Thus, we found that the integrated device shown in FIG. 5 emits a pulsed beam of output photonic radiation with pulses having lower chirp, shorter pulse width and at a higher rate with better mode quality than those previously produced by prior lasers in the art which use modulation of pumping current only.

Furthermore, prior art, such as disclosed in the Oka '393 patent, describes a laser with a series of active waveguides having different gain peak wavelengths and integrated on the same substrate for the purpose of reducing chirping. But, Oka teaches injection of both charge carriers (electrons and holes) into the active layer of the waveguide, thereby limiting its speed of operation compared to electron heating taught by the present invention. Also, Danner '633 teaches the use of an indirect bandgap material in his active layer, which requires a constant electric field to maintain the indirect bandgap in a direct bandgap state. Then, even if Danner used the present structural elements, any hypothetical electric field in his indirect bandgap material could not be controlled in intensity period or phase and still be operable as taught in the present invention.

Figure 6:
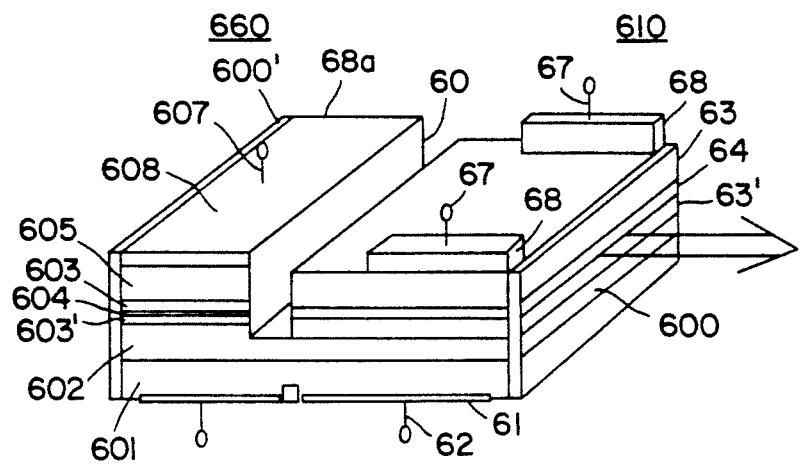
FIG. 6 illustrates in cross-section an integrated laser-modulator device constructed according to the invention.

FIG. 6 illustrates a monolithically integrated laser 660 and modulator 610 on substrate 601. Laser 660 and modulator 610 are cavity coupled and separated by groove 60, 1-3 microns thick. The active layer 64 of GaAs is surrounded by waveguiding layers 63 and 63' of AlGaAs which have higher bandgap and lower Index than the active layer 64, as discussed above. Cladding layer 62 and substrate 61 are common to both laser 660 and modulator 610. The optical axis of active layer 64 is aligned with the active layer 604, which may be a 100A thick n+ GaAs, and its two waveguiding AlGaAs layers 603 and 603'. An AR coating 600 is positioned on the face of active layer 64.

Electrodes 68 are deposited on the outside surfaces of waveguide layer 63, preferably with metals that dope layer 63 n-type so that the contact to active layer 64 is blocking to holes and conducting to electrons. The heating signal to contacts 68 is applied by heating leads 67 using a signal source for heating, such as that shown in FIG. 5, and that is synchronized with the pumping signal source.

Referring again to FIG. 6, the single quantum well (SGW) laser 660 is pumped by an external signal source, such as shown in FIG. 5, by applying a pumping signal between leads 607 and 607'. Lead 607 is electrically connected to metallic contact 608 which is deposited on the upper surface of p-type AlGaAs layer 605. The electrical connection to active layer 64 is completed through waveguide layer 603. The signal circuit loop to active layer 604 is completed through lead 607, metallic contact 611, n-type substrate 601, lower cladding layer 202, and lower waveguide 603'.

In fabrication, the groove 60 may be ion milled to a width of 1-3 um and to a depth that cuts through active layer 65 in order to electrically insulate the Pumping signal applied by lead 607 in laser 660 from the heating signal applied by leads 67 in modulator 610. The optical cavity of layer 64 is tuned by adjusting the length of the active layer 64 between the face of groove 60 and face 600' to fraction as a Fabrey-Perot cavity. The faces 600 and 600' may be covered with an AR coating if additional optical pumping from an external source is desired. In laser 660, the optical cavity is formed between groove 60 and face 600' in the active layer 604 and is similarly timed as a Fabrey-Perot cavity which results in a common cavity between the laser 660 and modulator 60 since the 1-3 um groove does not interfere significantly with multiple passes through the combined cavity. After such tuning for multiple passes, when a pumping signal is applied to lead 607 and a synchronized heating signal to lead 67, photonic pulses are emitted with fastest data bit rate and best mode selection.

Although the embodiments discussed above in connection with FIGS. 1-6 incorporated direct bandgap and waveguide active layers of GaAs and AlGaAs, other semiconductor materials can be used for the active waveguide and cladding layers of the modulator and in the laser sectors. For example, undoped InGaAsP fractions as a waveguided active layer between appropriate combinations of p-type InP:Zn, and n-type InP:Sn for use as a laser and a modulator. Suitable active layers can be epitaxially grown on InP substrate.

Indeed, the present invention may utilize semiconductor materials available for other electro-optic devices, but in contradiction to the prior art devices, in the present invention optical pumping is used to generate charge carriers when an electric field is applied synchronously inside the active layer, preferably through contacts that are conducting to one charge carrier and blocking to the other carrier, to raise the temperature of one charge carrier above lattice temperature.

We claim:

1. A method of controlling the output electromagnetic power of an optoelectric heterojunction semiconductor device comprising a direct bandgap active layer having a first conductivity type and a second conductivity type of mobile charge carriers, means for generating said first conductivity type and said second conductivity type of said mobile charge carriers in said direct bandgap active layer, and contact means for applying an electric field inside said direct bandgap active layer comprising:

generating a density of said first conductivity type and a density of said second conductivity type of said mobile charge carriers in said direct bandgap active layer;

applying an electric field inside said active layer to conduct one conductivity type of said mobile charge carriers; and controlling the said density of said first conductivity type and the said density of said second conductivity type of said mobile charge carriers and the intensity, period, and phase of said electric field inside said active layer to control the emission of pulses of electromagnetic radiation from said mobile charge carriers.

2. The method of claim 1 in which said means for generating said first conductivity type and said second conductivity type of mobile charge carriers comprises photonic radiation emitted by a laser and at least a portion of said density of said first conductivity type and said second conductivity type of said mobile charge carriers are optically generated by said photonic radiation emitted by said laser.

3. The method of claim 2 in which the energy of said photonic radiation is at least interband wavelength.

4. The method of claim 2 in which said laser is integrated monolithically on a common substrate with said contact means for applying an electric field inside said direct bandgap active layer.

5. The method of claim 4 in which said laser comprises a waveguide comprising an active layer between two semiconducting layers having higher bandgap and lower index of refraction than said active layer, and in which the optical axis of said waveguide and said direct bandgap active layer are aligned.

6. The method of claim 5 in which said laser is a distributed feedback laser.

7. The method of claim 5 in which said waveguide layer and said direct bandgap active layer comprise cavity coupled optical cavities separated by a groove that is semitransparent to photonic pulses emitted by said laser.

8. The method of claim 5 in which said optical cavities are Fabrey-Perot cavities.

9. The method of claim 2 further comprising a first signal source means electrically connected to said laser, a second signal source means applied to said contact means for applying said electric field inside said active layer and means for synchronizing said first and second signal source means to control the intensity, period and pulse width of said pulses of electromagnetic radiation from said mobile charge carriers.

10. The method of claim I in which said active layer is a quantum well consisting of a low bandgap semiconductor layer positioned between a first high bandgap layer and a second high bandgap layer.

11. The method of claim 9 in which a signal from a first signal generator is electrically connected to said first and second pumping contacts for supplying pumping current to said active layer.

12. The method of claim 1 in which said contact means for applying said electric field to said direct bandgap active layer comprises first and second field control contacts comprising doped semiconductors of the same conductivity type in conducting contact with one conductivity type of said mobile charge carriers and in blocking contact with the other conductivity type of said mobile charge carriers in said direct bandgap active layer.

13. The method of claim 12 in which said means for generating said first conductivity type and said second conductivity type of said mobile charge carriers comprises a first pumping contact comprising a doped semiconductor of one conductivity type applied to a first portion of said direct bandgap active layer and a second pumping contact comprising a doped semiconductor of a second conductivity type applied to a second portion of said direct bandgap active layer.

14. The method of claim 12 in which a first signal from a signal generator means is electrically connected to said first and second field control contacts for controlling the said period, intensity and phase of said electric field.

15. The method of claim 14 in which said first signal, having a first intensity, period, and phase connected to said first and said second field control contacts and a said second signal, having a second intensity period and phase, is connected to said generation means to modulate said pulses of said output electromagnetic power.

16. The method of claim 15 in which said first signal and said second signal are synchronously controlled to modulate said pulses of said output electromagnetic power.

17. The method of claim 15 in which said intensity, period, and phase of said first signal and said second signal are synchronously controlled to produce pulsed electromagnetic radiation with a controlled pulse duration.

18. The method of claim 1 in which said heterojunction semiconductor device comprises a laser and said pulse of said electromagnetic radiation are controlled spatially and temporally by said electric field.

19. The method of claim I in which said heterojunction device comprises a light emitting diode and said pulse of said electromagnetic radiation are controlled spatially and temporally by said electric field.

20. The method of claim 10 in which said direct bandgap active layer comprising said quantum well is a multiple quantum well.

21. A method of controlling the output electromagnetic power of an optoelectric heterojunction semiconductor device comprising a direct bandgap active layer having gain, a lattice temperature and a first conductivity type and a second conductivity type of mobile charge carriers with a statistical distribution of energies equated to an equivalent temperature, means for generating said first conductivity type and said second conductivity type of said mobile charge carriers in said direct bandgap active layer and means for heating one of said conductivity types of said mobile charge carriers inside said direct bandgap active layer, comprising:
  generating a density of said first conductivity type and a density of said second conductivity type of said mobile charge carriers in said direct bandgap active layer;
  heating one of said conductivity of said mobile charge carriers to a temperature above said lattice temperature; and
  controlling said density and said temperature of one of said conductivity types of said mobile charge carriers to control the gain of said direct bandgap active layer.

22. A high frequency, high bit-rate optoelectric semiconductor heterojunction device comprising:
  a direct bandgap active layer having a first conductivity type and a second conductivity type of mobile charge carriers;
  means for optically generating said first conductivity type and said second conductivity type of said mobile charge carriers in said direct bandgap active layer;
  contact means to conductively contact one conductivity type of said mobile charge carriers and to block the other conductivity type of said mobile charge carriers in said direct bandgap active layer;
  first signal means for applying a first periodic signal to said generation means;
  second signal means for applying a second periodic signal to said contact means; and
  means for synchronously controlling said first signal means and said second signal means.

* * * * *